United States Patent [19]

Prins et al.

[11] 4,001,706

[45] Jan. 4, 1977

[54] SINGLE-ENDED/PUSH-PULL CONVERTER

[75] Inventors: Albertus Prins, Moorebank, Australia; Henri Jan Velo, Hilversum, Netherlands

[73] Assignee: U.S. Philips Corporation, New York, N.Y.

[22] Filed: Oct. 14, 1975

[21] Appl. No.: 622,042

[30] Foreign Application Priority Data

Oct. 14, 1974 Netherlands ............... 7413448

[52] U.S. Cl. .................. 330/14; 330/18; 330/19; 330/20; 330/22; 330/30 R

[51] Int. Cl.² ............................. H03F 3/04

[58] Field of Search .............. 330/14, 15, 18, 19, 330/20, 22, 30 R, 38 M, 40, 117, 148

[56] References Cited

UNITED STATES PATENTS 3,914,704   10/1975   Craft ..................... 330/18

*Primary Examiner*—James B. Mullins
*Attorney, Agent, or Firm*—Frank R. Trifari; George B. Berka

[57] ABSTRACT

A single-ended/push-pull converter with an input emitter-follower transistor having a d.c. blocking emitter impedance and a collector impedance. The signal voltage across the collector impedance produces a signal current of opposite phase in a second emitter follower transistor having an input impedance which equals the collector impedance of the first transistor. The input circuit of a current mirror is included in the emitter circuit of the second emitter follower transistor and the output circuit is connected in parallel with the d.c. blocking impedance to keep the collector currents in the two emitter followers equal and constant.

4 Claims, 2 Drawing Figures

SINGLE-ENDED/PUSH-PULL CONVERTER

The invention relates to a single-ended/push-pull converter for converting a single-ended input signal into a push-pull output signal.

Figure 2:
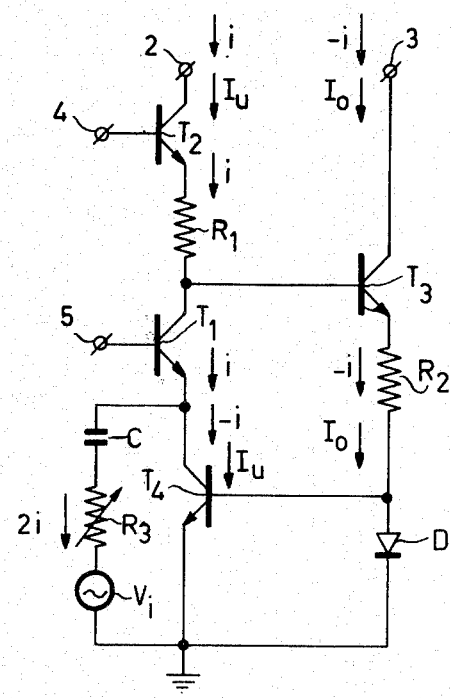

Such a converter is for example from German patent specification No. 1,101,528, FIG. 2. This concerns a circuit with two transistors of mutually the same conductivity type with a common emitter resistance. The collctor circuits of the two transistors constitute the push-pull output and the base electrode of the one transistor constitutes the single-ended input, whilst the base electrode of the other transistor is connected to a point of constant potential.

The drawback of such a converter is that the d.c. components in the push-pull output signal are dependent on the d.c. component of the input signal.

It is an object of the invention to provide a single-ended/push-pull converter, the d.c. component of the input signal having a negligible effect on the d.c. component of the push-pull output signal.

For this, the invention is characterized in that the single-ended/push-pull converter comprises a current mirror arrangement with a low-ohmic input circuit and a high-ohmic output circuit, the current in the output circuit bearing a fixed ratio to the current in the input circuit, a first transistor whose emitter circuit includes the output circuit of the current mirror arrangement and whose collector electrode is connected to a point of constant potential via the series connection of at least a first impedance and the base-emitter junction of a second transistor, of which second transistor the collector constitutes a first push-pull output, whilst the first transistor constitutes the signal input transistor of the single-ended/push-pull converter, a third transistor of the same conductivity type as the first transistor, of which third transistor the emitter circuit comprises the input circuit of the current mirror arrangement, the emitter circuit of the third transistor at least including a second impedance, and of which third transistor the base electrode is coupled to the collector electrode of the first transistor and the collector constitutes a second push-pull output, and a d.c. blocking impedance which shunts the output circuit of the current mirror arrangement.

When the converter according to the invention is for example employed as an input circuit for modulators of the phase-inverter type, in which the carrier wave is to be suppressed, the d.c. components of the push-pull output signal must be equal to a very high degree, because in such modulators a difference in the d.c. components of the push-pull output signal causes an output signal of carrier frequency and an amplitude equal to said difference.

In a push-pull/single-ended converter according to the invention said equality of d.c. components in the push-pull output signal is assured effectively, if the current mirror arrangement realizes a current in the output circuit which equals the current through the input circuit.

The single-ended input signal in the converter according to the invention may be applied to both the base and the emitter of the first transistor.

Instead of bipolar transistors field-effect transistors may also be employed, inter alia as input transistor. Collector, base and emitter should then read drain, gate and source electrode.

Figure 1:
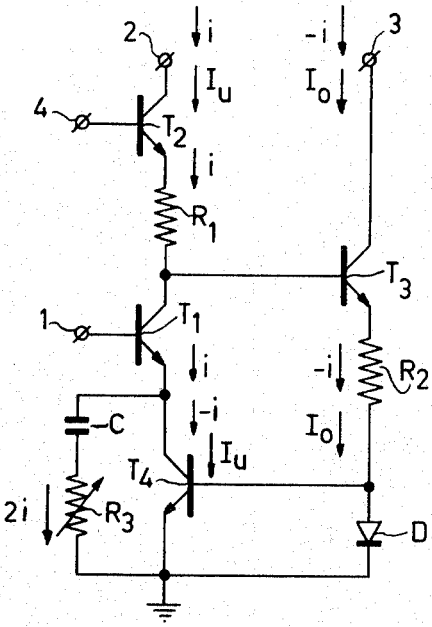

The invention will be described in more detail with reference to the drawing, in which FIG. 1 shows a first embodiment of a converter according to the invention, and FIG. 2 shows a preferred embodiment of a converter according to the invention.

The single-ended/push-pull converter of FIG. 1 includes a first transistor $T_1$, whose base electrode 1 constitutes the single-ended input. The emitter circuit of transistor $T_1$ includes the collector-emitter path of a transistor $T_4$ whose base-emitter junction is shunted by a diode $D_1$. In integrated circuits this diode $D_1$ will generally be a transistor which is connected as a diode. The diode $D_1$ and transistor $T_4$ together constitute a current mirror arrangement. When the converter is incorporated in an integrated circuit, the transistors being vertical transistors, and when diode $D_1$ is a transistor which is connected as a diode, the ratio of the emitter current of transistor $T_4$ and the current through the diode $D_1$ equals the ratio of the emitter areas of transistor $T_4$ and the transistor which is connected as a diode. The collector of transistor $T_1$ is connected to the base of transistor $T_3$ and via a resistor $R_1$ to the emitter of a transistor $T_2$ whose base is connected to a point 4 of constant potential and whose collector is connected to a first push-pull output terminal 2. The collector of transistor $T_3$ is connected to a second push-pull output terminal 3, while the emitter of transistor $T_3$ is connected to the base of transistor $T_4$ via a resistor $R_2$. The collector-emitter path of transistor $T_4$, i.e. the output circuit of the current mirror ($T_4$, $D_1$) is shunted by the series connection of an isolating capacitor C and a variable resistor $R_3$.

In the description of the operation of the single-ended/push-pull converter of FIG. 1 it is assumed for simplicity that the impedance of the capacitor C for signal currents is negligible relative to the resistor $R_3$, that the base currents of the various transistors are negligible and that in the current mirror the output current $I_u$ equals the input current $I_o$. The input direct current $I_o$ of the current mirror is determined by the ratio of the voltage at point 4 and the impedance of the circuit which includes the base-emitter junction of ransistor $T_2$, the resistor $R_1$, the base-emitter junction of transistor $T_3$, the resistor $R_2$ and the diode $D_1$. Said input current $I_o$ is independent of the d.c. level at the base of transistor $T_1$, because this d.c. level cannot influence the emitter direct current of transistor $T_1$, which emitter direct current is only determined by the output current $I_u$ and thus the input current $I_o$ of the current mirror. In the case of an equal input and output current of the current mirror and negligible base currents, the d.c. components in the collector circuits of the transistors $T_2$ and $T_3$ are equal.

A signal voltage component $V_i$ at the base of transistor $T_1$ will cause an emitter signal-current component $i$, as shown in FIG. 1. When neglecting the base currents said signal current flows through the resistor $R_1$ and through the push-pull output terminal 2. Apart from the differential resistance of the emitter-base junction of transistor $T_2$, said signal current reduces the base potential of transistor $T_3$ by a voltage equal to $iR_1$. This signal voltage causes a signal current $-i(R_1/R_2)$ in the resistor $R_2$, when neglecting the differential resistances of the base-emitter junction of transistor $T_3$ and of the diode $D_1$. If $R_1 = R_2$, said signal current which also flows in the collector circuit of transistor $T_3$ equals $-i$. Owing to the current mirror said signal current $-i$ also flows in the collector circuit of transistor $T_4$, so that a signal current equal to $2i$ flows through resistor $R_3$. The signal voltage across the resistor $R_3$ then equals $2iR_3$, which signal voltage apart from the base-emitter voltage of transistor $T_1$ equals the input voltage $V_i$, that $i = V_i/2R_3$. The gain of the single-ended/push-pull converter may consequently be controlled with the aid of the resistor $R_3$. This control does not affect the d.c. components in the push-pull output signal.

The single-ended input signal $V_i$ is usually obtained from a pre-amplifier. Generally, use is then made of d.c. decoupling by means of a capacitor. This capacitor may be dispensed with in the embodiment of FIG. 2.

The converter of FIG. 2 corresponds to the converter of FIG. 1 except for the single-ended input. The base of transistor $T_1$ is connected to a point 5 of constant potential and the input voltage $V_i$ is applied in series with the variable resistor $R_3$.

As the signal voltage $V_i$ drives transistor $T_1$ at the emitter said signal voltage $V_i$ causes a signal current $i$ in the collector circuit of transistor $T_1$. If the impedance of the capacitor C for signal current is neglected this signal current $i$ will be $i = -S/(1 + 2SR_3) V_i$, $S$ being the slope of the transistor $T_1$. In a similar way as with the converter of FIG. 1 said signal current $i$ substantially causes a signal voltage $-iR_1$ at the base of the transistor $T_3$, so that the collector signal current of transistor $T_3$ substantially equals $-i(R_1/R_2)$. For $R_1 = R_2$, similarly to the converter of FIG. 1, the collector signal current of transistor $T_3$ is equal but in phase opposition to the collector signal current of transistor $T_2$.

It is evident that the invention is not limited to the embodiment shown. For the current mirror numerous embodiments with or without resistors may be selected. For example, the resistor $R_2$ may form part of the current mirror. A current-mirror ratio unequal to unity is also possible if a specific ratio of output d.c. components is desired. A difference in amplitude of the signal output current components can be obtained by selecting the resistor $R_2$ to be unequal to the resistor $R_1$. Similarly, frequency-dependent impedances may be selected for the resistors $R_1$, $R_2$ and $R_3$. A filter action is in particular obtained by selecting a filter instead of the resistor $R_3$. Moreover, the invention is not limited to the transistor types shown.

What is claimed is:

1. A single-ended/push-pull converter for converting a single-ended input signal into a push-pull output signal, comprising a current mirror arrangement with a low-ohmic input circuit and a high-ohmic output circuit, the current in the output circuit bearing a fixed ratio to the current in the input circuit, a first transistor whose emitter circuit includes the output circuit of the current mirror arrangement and whose collector electrode is connected to a point of constant potential via the series connection of at least a first impedance and the base-emitter junction of a second transistor, of which second transistor the collector constitutes a first push-pull output, while an electrode of the first transistor constitutes the single-ended signal input, a third transistor of the same conductivity type as the first transistor, of which third transistor the emitter circuit includes a second impedance and the input circuit of the current mirror arrangement, and of which third transistor the base electrode is coupled to the collector electrode of the first transistor, and the collector constitutes a second push-pull output, and a d.c. blocking impedance which shunts the output circuit of the current mirror arrangement.

2. A single-ended/push-pull converter as claimed in claim 1, wherein the current mirror arrangement produces a current in the output circuit which equals the current through the input circuit.

3. A single-ended/push-pull converter as claimed in claim 1, wherein the base electrode of the first transistor is connected to a second point of constant potential and that the circuit which shunts the output circuit of the current mirror arrangement and which includes the d.c. blocking impedance is adapted to receive the single-ended input signal.

4. A single-ended/push-pull converter as claimed in claim 1 wherein the base electrode of the first transistor is connected to an input terminal for receiving the single-ended input signal.

* * * * *